United States Patent
Shih et al.

(10) Patent No.: US 7,112,458 B2
(45) Date of Patent: Sep. 26, 2006

(54) METHOD OF FORMING A LIQUID CRYSTAL DISPLAY

(75) Inventors: Chu-Jung Shih, Taipei (TW); Gwo-Long Lin, Hsin-Chu (TW); I-Min Lu, Taipei (TW)

(73) Assignee: TPO Displays Corp., Miao-Li (TW)

( * ) Notice: Subject to any disclaimer, the term of this patent is extended or adjusted under 35 U.S.C. 154(b) by 293 days.

(21) Appl. No.: 10/605,499

(22) Filed: Oct. 2, 2003

(65) Prior Publication Data

US 2005/0072754 A1   Apr. 7, 2005

(51) Int. Cl.
*H01L 21/302* (2006.01)
(52) U.S. Cl. .................. 438/30; 438/149; 438/239; 438/378; 438/609; 438/694; 438/697; 438/699
(58) Field of Classification Search ............... 438/30, 438/149, 239, 378, 535, 608, 609, 694, 697, 438/699
See application file for complete search history.

(56) References Cited

U.S. PATENT DOCUMENTS

| 6,773,467 B1 * | 8/2004 | Shih ................. 29/25.03 |
| 6,924,874 B1 * | 8/2005 | Lin et al. ............ 349/187 |

FOREIGN PATENT DOCUMENTS

| JP | P2000-305107 A | 11/2000 |
| JP | P2001-189459 A | 7/2001 |
| JP | P2003-75870 A | 3/2003 |

* cited by examiner

*Primary Examiner*—George A. Goudreau
(74) *Attorney, Agent, or Firm*—Winston Hsu

(57) ABSTRACT

An active layer of a P-type low temperature polysilicon thin film transistor and a bottom electrode of a storage capacitor are first formed. Then, a P-type source/drain is formed and the bottom electrode is doped with dopants. A gate insulator, a gate electrode, a capacitor dielectric, and a top electrode are thereafter formed. Finally, a source interconnect, a drain interconnect, and a pixel electrode of the liquid crystal display are formed.

15 Claims, 19 Drawing Sheets

US 7,112,458 B2

METHOD OF FORMING A LIQUID CRYSTAL DISPLAY

BACKGROUND OF INVENTION

1. Field of the Invention

The present invention relates to a method of fabricating a low temperature polysilicon thin film transistor liquid crystal display (LTPS TFT-LCD), and more particularly, to a method of fabricating a LTPS TFT-LCD composed of P-type LTPS TFT by utilizing seven photo-etching processes (PEPs).

2. Description of the Prior Art

Currently, liquid crystal displays (LCDs) represent a commona flat panel display technology. Applications for LCDs are extensive and include mobile phones, digital cameras, video cameras, notebooks, and monitors. Due to high quality display requirements and the expansion of new application fields, the development of LCDs have found on the following criteria: high resolution, high brightness, and low price. Development of LTPS TFTs, being actively driven, has been a break-through in achieving the above objectives. Therefore, technological innovation based on the LTPS TFT concept has become an important subject for further development.

Please refer to FIG. 1 to FIG. 8. FIG. 1 to FIG. 8 are schematic diagrams of a method for forming a LTPS TFT-LCD according to a prior art. The prior art LTPS TFT-LCD 98 is formed on an insulation substrate 10. The insulation substrate 10, composed of transparent materials, may be a glass substrate or a quartz substrate. A pixel array area 11 and a periphery circuit area 13 are formed on a surface of the insulation substrate 10.

As shown in FIG. 1, an amorphous silicon (α-Si) thin film (not shown) is first formed on the surface of the insulation substrate 10. Then, an excimer laser annealing (ELA) process is performed to re-crystallize the amorphous silicon thin film into a polysilicon layer (not shown). A first photo-etching processes (PEP-1) is thereafter performed to define an active area 12 in the pixel array area 11 and at least one active area 14 in the periphery circuit area 13. A source region (not shown), a drain region (not shown), a channel region (not shown), and a predetermined region for a bottom storage electrode (not shown) are formed in the active area 12; a source region (not shown), a drain region (not shown), and a channel region (not shown) are formed in each active area 14.

As shown in FIG. 2, a second photo-etching process (PEP-2) is performed to form a photoresist layer 16 on the top surface of the insulation substrate 10. The photoresist layer 16 is used to define the location for the bottom storage electrode 18 in the pixel array area 11. After that, an ion implantation process is performed to add high concentration N-type dopants into the exposed portion of the active area 12 in the pixel array area 11, completing the fabrication of the bottom storage electrode 18.

The photoresist layer 16 is removed. As shown in FIG. 3, an isolation layer 22 and a first conductive layer (not shown) are formed on a surface of the entire structure sequentially. Then a third photo-etching process (PEP-3) is performed to simultaneously form a gate electrode 24 of a TFT, a top storage electrode 26 on the bottom storage electrode 18 in the pixel array area 11, a gate electrode 28 of an NMOS and a gate electrode 32 of a PMOS in the periphery circuit area 13.

As shown in FIG. 4, an etching process is performed, by utilizing the gate electrodes 24, 28, 32, and the top storage electrode 26 as etching masks, to remove portions of the isolation layer 22 to form the gate insulating layers 34, 36, 38, and the capacitor dielectric layer 42. The manufacturing of the storage capacitor 44 is thus completed.

After that, an ion implantation process, by utilizing the gate electrodes 24, 28, 32 as masks, is performed to dope low concentration N-type ions into the active areas 12, 14 at either side of the gate electrodes 24, 28, 32 to form lightly doped drains (LDDs) 46, 48, 52. Due to the low concentration N-type ions implanted in this ion implantation process, the doping concentration of the bottom storage electrode 18 is not affected.

As shown in FIG. 5, a fourth photo-etching process (PEP-4) is performed to form a photoresist layer 54 on a surface of the entire structure. The photoresist layer 54 covers the gate electrode 24 and the predetermined region for a lightly doped drain 56 in the pixel array area 11 and simultaneously covers the predetermined region for a PMOS in the periphery circuit area 13. An ion implantation process is thereafter performed to dope high concentration N-type ions to form a source electrode 62 and a drain electrode 64 of a TFT 58 in the active area 12 in the pixel array area 11 and simultaneously form a source electrode 68 and a drain electrode 72 of an NMOS 66 in the active area 14 in the periphery circuit area 13.

The photoresist layer 54 is removed. As shown in FIG. 6, a fifth photo-etching process (PEP-5) is performed to form a photoresist layer 74 on a surface of the entire structure. The photoresist layer 74 exposes the predetermined region for the PMOS 76 in the periphery circuit area 13. After that, an ion implantation process is performed to dope high concentration P-type ions to form a source electrode 78 and a drain electrode 82 of the PMOS 76 in the active area 14 in the periphery circuit area 13. Due to the high concentration P-type ions implanted in this ion implantation process, the previously formed N-type lightly doped drain 52 (shown in FIG. 5) is compensated and the source electrode 78 and the drain electrode 82 are thus formed.

The photoresist layer 74 is then removed. As shown in FIG. 7, an isolation layer 84 is formed on a surface of the entire structure. The isolation layer 84 covers the gate electrodes 24, 28, 32 and the top storage electrode 26. Then a sixth photo-etching process (PEP-6) is performed to remove portions of the isolation layer 84 to form a plurality of contact holes 85. The contact holes 85 are electrically connected to the source electrodes 62, 68, 78 and the drain electrodes 72, 82, respectively. A source wire 86, electrically connected to the source electrode 62, is formed on top of the isolation layer 84 in the pixel array area 11. Source wires 88, electrically connected to the source electrodes 68, 78 respectively, are formed on top of the isolation layer 84 in the periphery circuit area 13. A wire 92 electrically connecting the NMOS 66 to the PMOS 76 is formed to complete the manufacturing of the CMOS.

As shown in FIG. 8, an isolation layer 94 is formed on a surface of the entire structure to cover the isolation layer 84, the source wires 86, 88, and the wire 92. A seventh photo-etching process (PEP-7) is performed to remove portions of the isolation layer 94 to form a contact hole 95. The contact hole 95 extends downward and is electrically connected to the drain electrode 64. A transparent conductive layer is thereafter formed on the isolation layer 94. Finally, an eighth photo-etching process (PEP-8) is performed to remove portions of the transparent conductive layer to form a pixel electrode 96 on the isolation layer 94. The pixel electrode 96 is electrically connected to the drain electrode 64 downward though the contact hole 95 filled with the transparent conductive layer (not shown) to complete the fabrication of the LTPS TFT-LCD 98.

However, the prior art method for forming the LTPS TFT-LCD results in a very severe problem. When forming the bottom storage electrode, the source electrode, the drain electrode, and the lightly doped drain electorde, three different photoresist layers and four different ion implantation processes required. When forming each photoresist layer, a photolithography process that tends to cause alignment error is required. After so many and complicated photolithography processes, defects are unavoidable in the product. Specifically, the alignment errors incurred from forming the gate electrode and the alignment errors incurred from forming the source electrode and the drain electrode of the thin film transistor in the pixel array area often result in the lightly doped drain having an uneven width. The asymmetric lightly doped drain cannot inhibit the hot electron effect. Moreover, an early breakdown of the device is likely to happen.

Furthermore, the prior art method for forming the LTPS TFT-LCD, following the integrated circuits industry, integrates CMOS. However, with both the NMOS and the PMOS in the circuits, it is impossible to decrease the number of photolithography and ion implantation processes. In addition, the magnitude of the leakage current of the N-type LTPS TFT is difficult to control, resulting in problems in image quality when the N-type LTPS TFT is used in the pixel array area. Therefore, it is very important to develop a method of forming a LTPS TFT-LCD having reduced manufacturing complexity and fewer photolithography processes to lower the probability of misalignment, improve the device defect problem, and improve production yield and image quality.

SUMMARY OF INVENTION

It is therefore an object of the claimed invention to provide a method of fabricating a LTPS TFT-LCD, specifically, a method of fabricating a LTPS TFT-LCD composed of P-type LTPS TFTs with precise alignment and superior reliability by utilizing seven photo-etching processes.

According to the claimed invention, an insulation substrate is provided first. At least one active area of a P-type LTPS TFT and at least one bottom storage electrode of a storage capacitor, composed of polysilicon, are formed on a surface of the insulation substrate. Each active area comprises a source region, a drain region, and a channel region. Then a second photo-etching process and a P-type ion implantation process are performed to form at least one source electrode and at least one drain electrode in each source region and each drain region, respectively, and to simultaneously dope dopants into each bottom storage electrode. A metal layer is thereafter formed on the insulation substrate to cover each active area and each bottom storage electrode. After that, a third photo-etching process is performed to remove portions of the metal layer to form a gate electrode of each P-type low temperature polysilicon thin film transistor on each channel region to complete the fabrication of each P-type LTPS TFT, and to form a top storage electrode of each storage capacitor on each bottom storage electrode to complete the fabrication of each storage capacitor.

A first isolation layer is then formed on the insulation substrate to cover each gate electrode and each top storage electrode. A fourth photo-etching process is thereafter performed to remove portions of the first isolation layer to form at least one first contact hole electrically connected to each source electrode, each drain electrode, and each gate electrode. After that, a conductive layer is formed on the first isolation layer to fill in each first contact hole. A fifth photo-etching process is then performed to remove portions of the conductive layer to form at least one source wire and at least one drain wire on the first isolation layer. Each source wire and each drain wire are electrically connected to each source electrode and each drain electrode through each first contact hole respectively. Finally, a second isolation layer is formed on the insulation substrate to cover the first isolation layer, each source wire, and each drain wire.

Since the claimed invention method fabricates the LCD-composed of P-type LTPS TFTs by utilizing five photo-etching processes, not only is the number of the photolithography processes and ion implantation processes decreased to simplify the process, the risk of alignment errors occurring is also reduced to improve the device defect problem. As a result, high reliability performance is improved. Furthermore, since the leakage current of the P-type LTPS TFT is lower than that of the N-type LTPS TFT, and the leakage current of the P-type LTPS TFT is more easily controlled, the present invention method effectively improves the electrical performance of the display, and significantly improves the image quality.

These and other objectives of the claimed invention will no doubt become obvious to those of ordinary skill in the art after having read the following detailed description of the preferred embodiment that is illustrated in the various figures and drawings.

DETAILED DESCRIPTION

Figure 1:
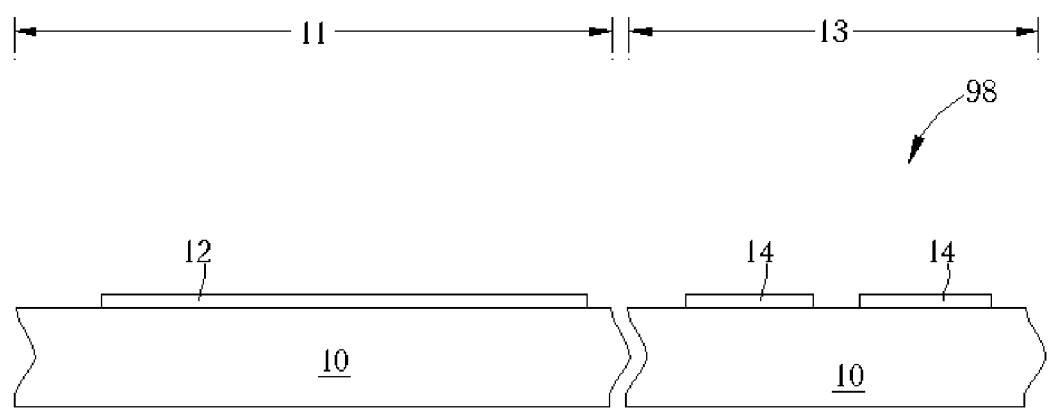
FIG. 1 to FIG. 8 are schematic diagrams of a method for forming a LTPS TFT-LCD according to a prior art.
Figure 2:
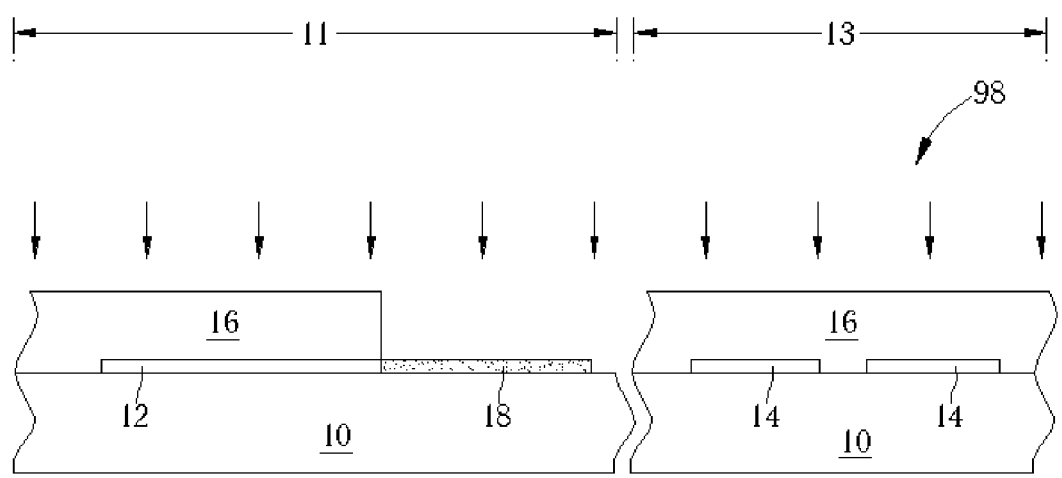
Figure 3:
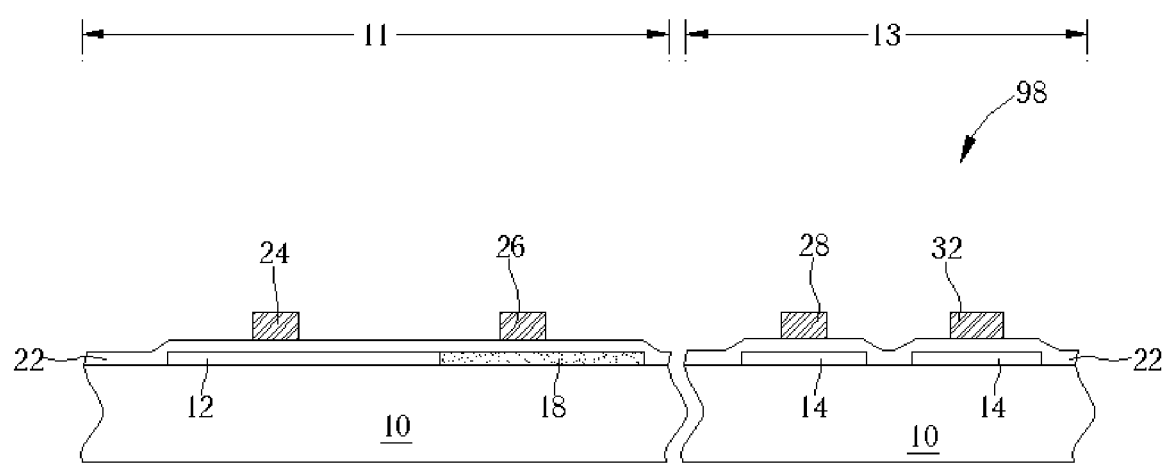
Figure 4:
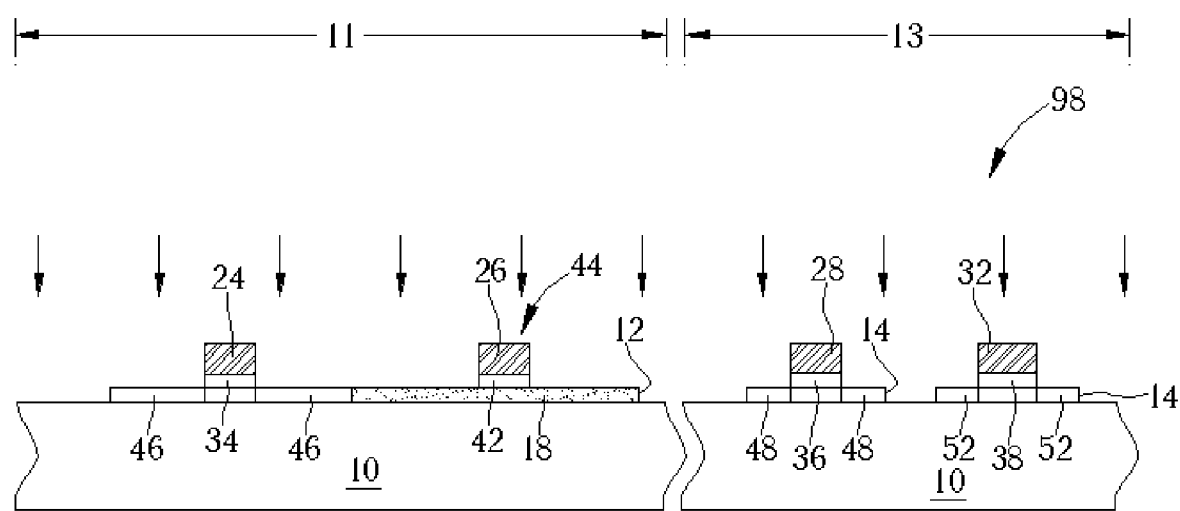
Figure 5:
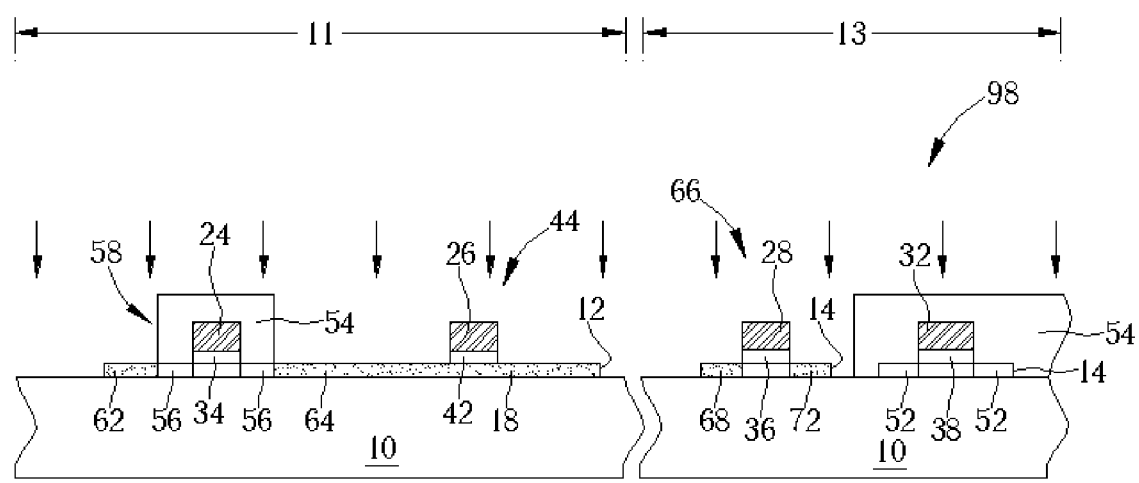
Figure 6:
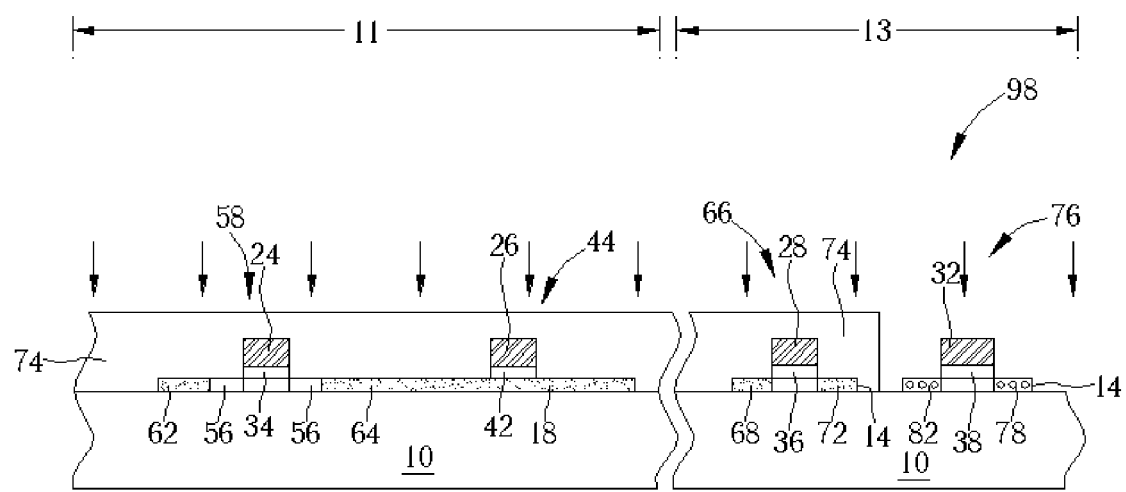
Figure 7:
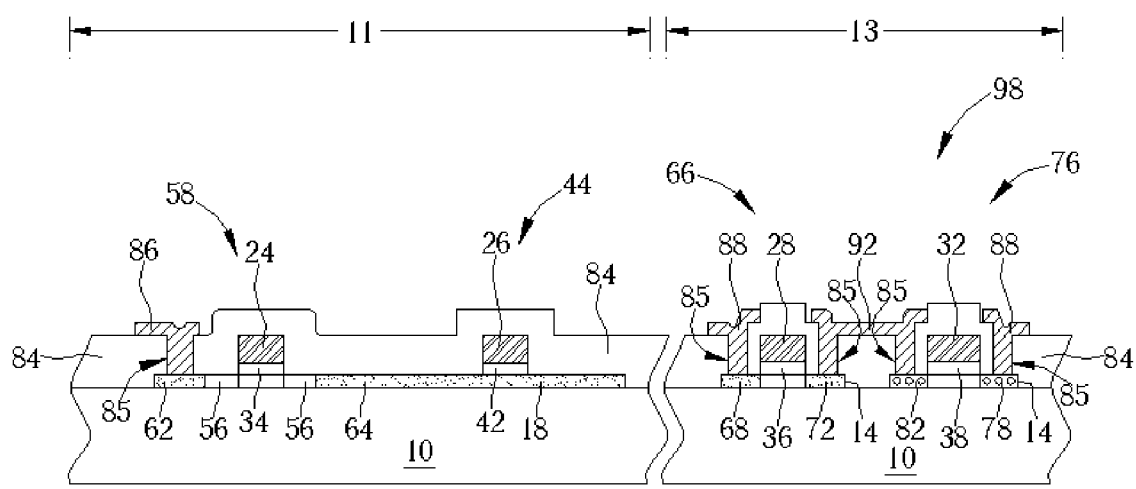
Figure 8:
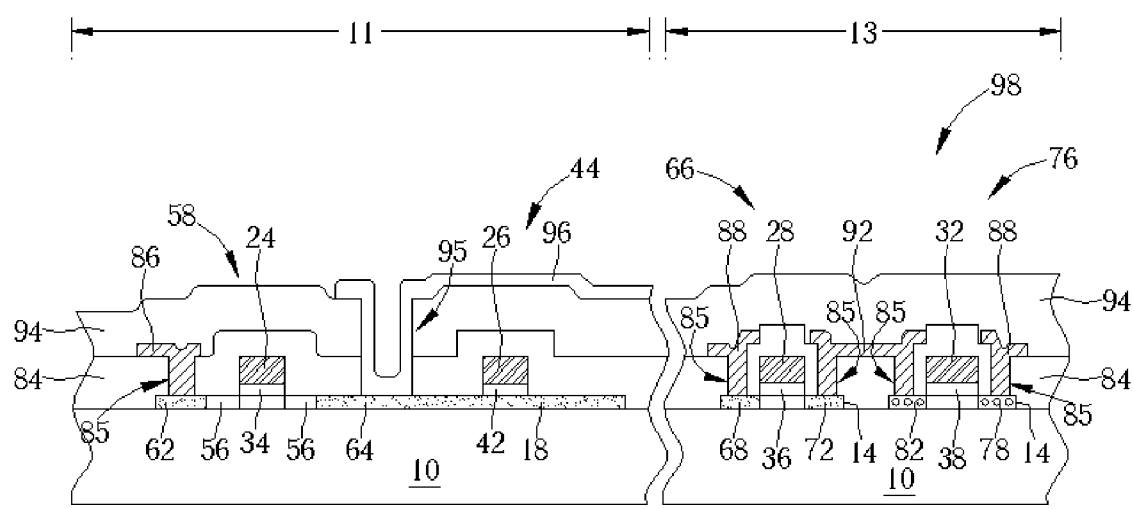
Figure 9:
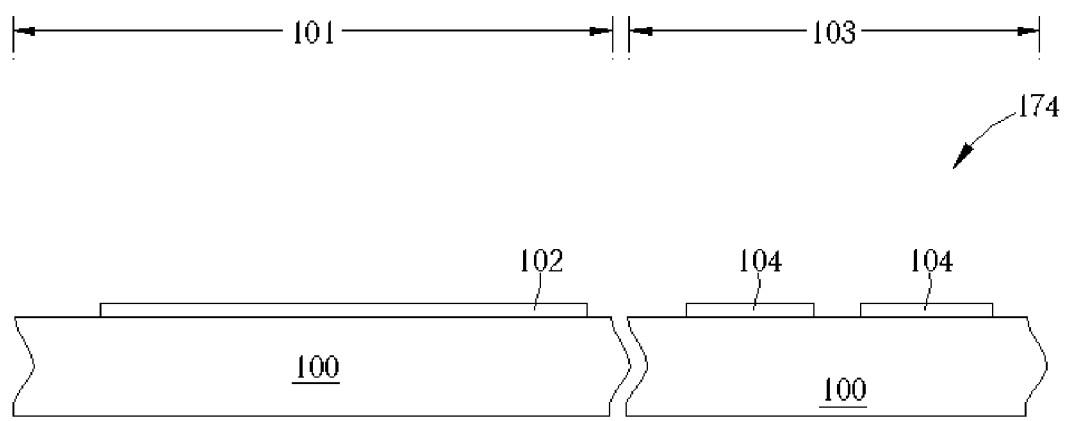
FIG. 9 to FIG. 13 are schematic diagrams of a method for forming a LTPS TFT-LCD according to a first preferred embodiment of the present invention.

Please refer to FIG. 9 to FIG. 13. FIG. 9 to FIG. 13 are schematic diagrams of a method for forming a LTPS TFT-LCD 174 according to a first preferred embodiment of the present invention. As shown in FIG. 9, an insulation substrate 100, composed of transparent materials, may be a glass substrate or a quartz substrate. A pixel array area 101 and a periphery circuit area 103 are defined on a surface of the insulation substrate 100.

The present invention method first utilizes a sputtering process or other deposition process to form an amorphous silicon thin film (not shown) on the surface of the insulation substrate 100. Then, an excimer laser annealing (ELA) process is performed to re-crystallize the amorphous silicon thin film into a polysilicon layer (not shown). A first photo-etching process is thereafter performed to remove portions of the polysilicon layer to form an active area 102 in the pixel array area 101 and at least one active area 104 in the periphery circuit area 103. A source region (not shown), a drain region (not shown), a channel region (not shown), and a predetermined region for a bottom storage electrode (not shown) are comprised on a surface of the active area 102. A source region (not shown), a drain region (not shown), and a channel region (not shown) are comprised on a surface of each active area 104. It should be noted that the excimer laser annealing process might be performed after the first photo-etching process.

Figure 10:
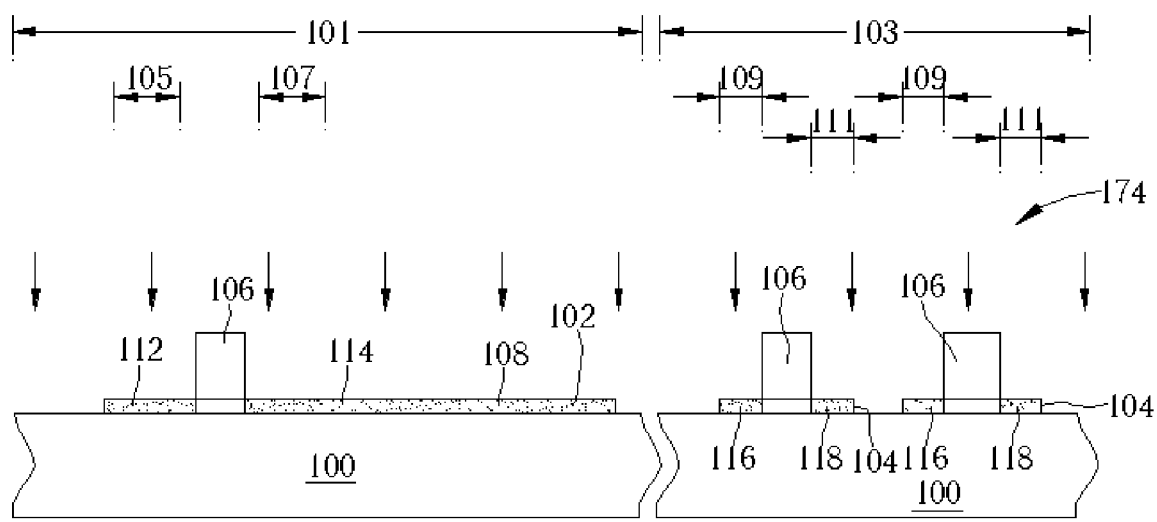

As shown in FIG. 10, a second photo-etching process is performed to form a first mask 106 on the insulation substrate 100. The first mask 106 exposes the source region 105, the drain region 107, and the bottom storage electrode 108 in the active area 102 in the pixel array area 101, and simultaneously exposes the source regions 109 and the drain regions 111 in the active area 104 in the periphery circuit area 103. In order to integrate the devices, the bottom storage electrode 108 is contiguous to the drain region 107 in the preferred embodiment of the present invention. An ion implantation process is thereafter performed to dope high concentration P-type ions by utilizing the first mask 106 as a mask. A source electrode 112 and a drain electrode 114 are formed in the active area 102 in the pixel array area 101, the bottom storage electrode 108 is doped with P-type dopants, and source electrodes 116 and drain electrodes 118 are simultaneously formed in the active area 104 in the periphery circuit area 103.

Figure 11:
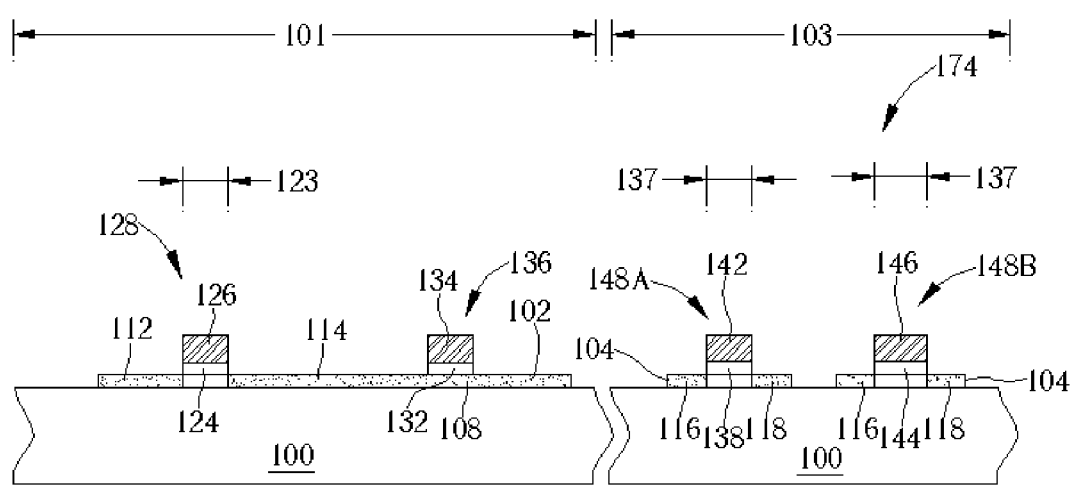

The first mask 106 is removed after the ion implantation process. As shown in FIG. 11, a first isolation layer (not shown) and a metal layer (not shown) are formed on a surface of the entire structure sequentially. The first isolation layer and the metal layer cover the active areas 102, 104, and the bottom storage electrode 108. The first isolation layer is a single-layered structure or a double-layered structure. The material composition of the first isolation layer comprises silicon oxide, silicon nitride, or silicon oxide which is deposited by utilizing tetra-ethyl-ortho-silicate as a reaction gas, etc. The material composition of the metal layer comprises tungsten (W) or chrome (Cr). Furthermore, a cleaning process may be performed before forming the first isolation layer. By utilizing an ozone solution, the surfaces of the active areas 102, 104 and a surface of the bottom storage electrode 108 are cleaned to remove the native oxide layer (not shown) on the active areas 102, 104 and the bottom storage electrode 108. The surfaces of the active areas 102, 104 and the bottom storage electrode 108 thus become passive to prevent the polysilicon from oxidizing before the first isolation layer is formed to ensure the channel region is not contaminated.

A third photo-etching process is thereafter performed to remove portions of the first isolation layer and the metal layer to form a gate insulating layer 124 and a gate electrode 126 on the channel region 123 in the pixel array area 101 and complete the fabrication of the P-type LTPS TFT 128, and to form a capacitor dielectric layer 132 and a top storage electrode 134 on top of the bottom storage electrode 108 and complete the fabrication of the storage capacitor 136. Simultaneously, gate insulating layers 138, 144 and gate electrodes 142, 146 of the P-type LTPS TFT are formed on the channel region 137 in the periphery circuit area 103 to complete the fabrication of the P-type LTPS TFT 148A, 148B.

It should be noted that since the first isolation layer, being a single-layered structure or a double-layered structure, is not etched up or even not etched at all when performing the third photo-etching process. The first isolation layers being underneath the gate electrodes 126, 142, 146 and the top storage electrode 134 are taken as the gate insulating layers 124, 138, 144 and the capacitor dielectric layer 132. In the figures, the first isolation layer is shown completely removed to illustrate the preferred embodiment of the present invention. In addition, the thicknesses of the gate insulating layers 124, 138, 144 are all less than the thickness of the gate electrodes 126, 142, 146.

Figure 12:
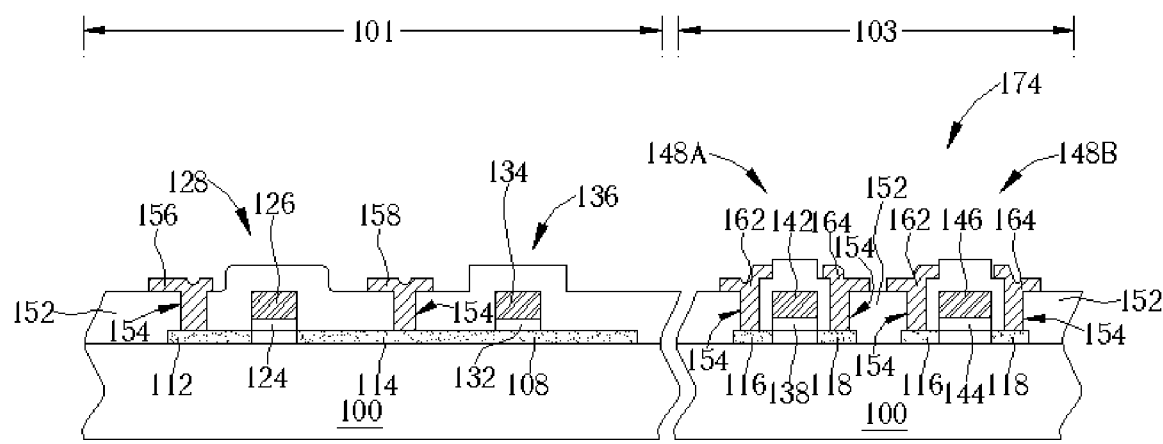

As shown in FIG. 12, a second isolation layer 152 is formed on a surface of the entire structure to cover the gate electrodes 126, 142, 146 and the top storage electrode 134. The material composition of the second isolation layer 152 comprises silicon oxide, silicon nitride, or silicon oxynitride. After that, a fourth photo-etching process is performed to remove portions of the second isolation layer 152 to form a plurality of first contact holes 154, electrically connected to the source electrodes 112, 116 and the drain electrodes 114, 118, respectively.

A conductive layer (not shown) is thereafter formed on a surface of the second isolation layer 152. The conductive layer fills up the first contact holes 154. Then a fifth photo-etching process is performed to remove portions of the conductive layer to form a source wire 156, electrically connected to the source electrode 112, on the surface of the second isolation layer 152 used as a data line of the LTPS TFT-LCD, and to form a drain wire 158, electrically connected to the drain electrode 114, in the pixel array area 101. Source wires 162, electrically connected to the source electrodes 116, and drain wires 164, electrically connected the drain electrodes 118, are formed on the surface of the second isolation layer 152 in the periphery circuit area 103 depending on practical requirements. It should be noted that a contact hole and a wire may be formed on top of the gate electrode.

Figure 13:
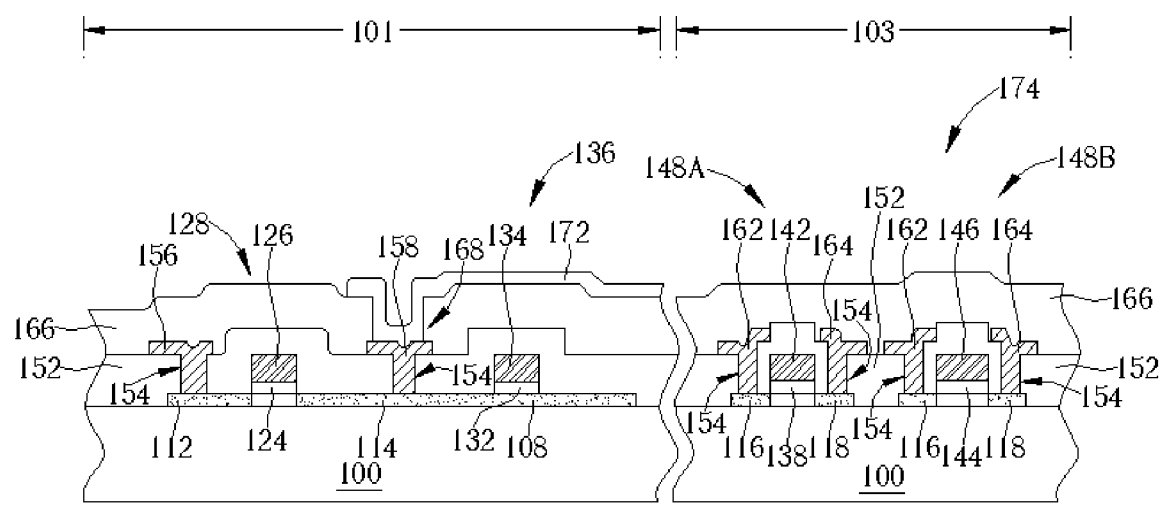

As shown in FIG. 13, a third isolation layer 166 is formed on a surface of the entire structure to cover the second isolation layer 152, the source wires 156, 162, and the drain wires 158, 164. The material composition of the third isolation layer 166, being a planarization layer, comprises silicon oxide, silicon nitride, or silicon oxide deposited by utilizing tetra-ethyl-ortho-silicate as a reaction gas. A sixth photo-etching process is performed to remove portions of the third isolation layer 166 to form a second contact hole 168 electrically connected to the drain wire 158. After that, a transparent conductive layer (not shown) is formed on the third isolation layer 166. The material composition of the transparent conductive layer comprises indium tin oxide (ITO) or indium zinc oxide (IZO). Finally, a seventh photo-etching process is performed to remove portions of the transparent conductive layer to form a pixel electrode 172 on the third isolation layer 166. The pixel electrode 172 is electrically connected to the drain wire 158 and the drain electrode 114 downward though the second contact hole 168 filled with the transparent conductive layer to complete the fabrication of the low temperature polysilicon thin film transistor liquid crystal display 174.

Figure 14:
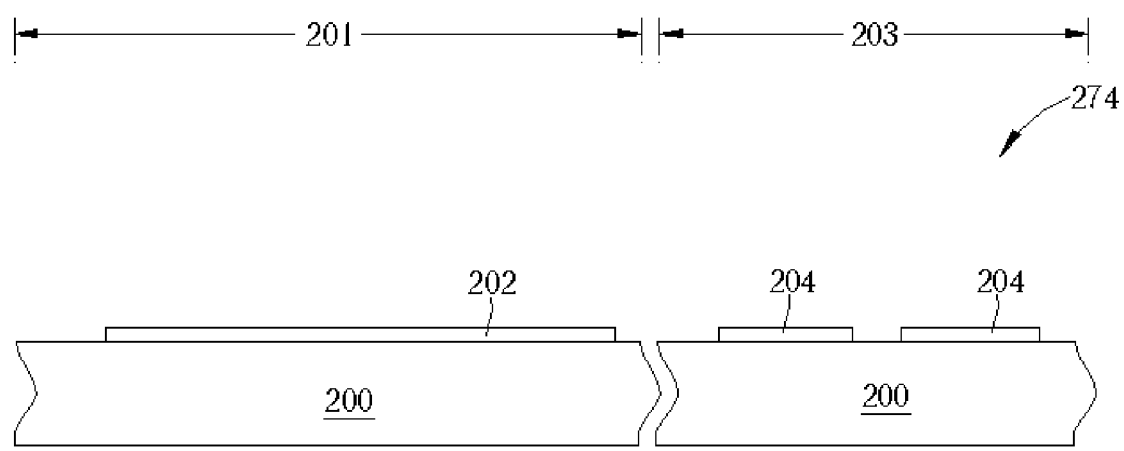
FIG. 14 to FIG. 19 are schematic diagrams of a method for forming a LTPS TFT-LCD according to a second preferred embodiment of the present invention.

Please refer to FIG. 14 to FIG. 19, FIG. 14 to FIG. 19 are schematic diagrams of a method for forming a LTPS TFT-LCD 274 according to a second preferred embodiment of the present invention. As shown in FIG. 14, the present invention LTPS TFT-LCD is formed on an insulation substrate 200. The insulation substrate 200, composed of transparent materials, may be a glass substrate or a quartz substrate. A pixel array area 201 and a periphery circuit area 203 are defined on a surface of the insulation substrate 200.

The present invention method first utilizes a sputtering process or other deposition process to form an amorphous silicon thin film (not shown) on the surface of the insulation substrate 200. Then, an excimer laser annealing (ELA) process is performed to re-crystallize the amorphous silicon thin film into a polysilicon layer (not shown). A first photo-etching process is thereafter performed to remove portions of the polysilicon layer to form an active area 202 in the pixel array area 201 and at least one active area 204 in the periphery circuit area 203. A source region (not shown), a drain region (not shown), a channel region (not shown), and a predetermined region for a bottom storage electrode (not shown) are formed on a surface of the active area 202. A source region (not shown), a drain region (not shown), and a channel region (not shown) are formed on a surface of each active area 204. It should be noted that the excimer laser annealing process might be performed after the first photo-etching process.

Figure 15:
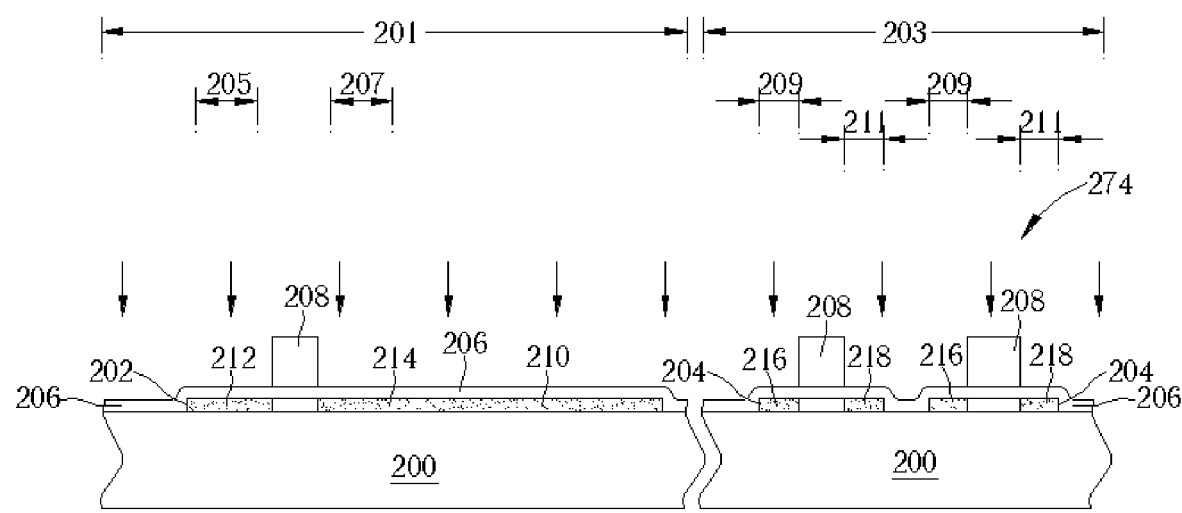

As shown in FIG. 15, a first isolation layer 206 is formed on a surface of the insulation substrate 200. The first isolation layer 206 covers the active areas 202, 204. The first isolation layer 206 is a single-layered structure or a double-layered structure. The material composition of the first isolation layer 206 comprises silicon oxide, silicon nitride, or siliconoxide which is deposited by utilizing tetra-ethyl-ortho-silicate as a reaction gas. Furthermore, a cleaning process may be performed before forming the first isolation layer 206. By utilizing an ozone solution, the surfaces of the active areas 202, 204 are cleaned to remove the native oxide layer (not shown) on the active areas 202, 204. The surfaces of the active areas 202, 204 thus become passive to prevent the polysilicon from oxidizing before the first isolation layer 206 is formed to ensure the channel region (not shown) is not contaminated.

Then, a second photo-etching process is performed to form a first mask 208 on the insulation substrate 200. The first mask 208 exposes the source region 205, the drain region 207, and the bottom storage electrode 210 in the active area 202 in the pixel array area 201, and simultaneously exposes the source regions 209 and the drain regions 211 in the active area 204 in the periphery circuit area 203. In order to integrate the devices, the bottom storage electrode 210 is contiguous to the drain region 207 in the preferred embodiment of the present invention. An ion implantation process is thereafter performed to dope high concentration P-type ions by utilizing the first mask 208 as a mask. A source electrode 212 and a drain electrode 214 of a P-type LTPS TFT (not shown) are formed in the active area 202 in the pixel array area 201, the bottom storage electrode 210 is doped with P-type dopants, and source electrodes 216 and drain electrodes 218 of P-type LTPS TFTs (not shown) are simultaneously formed in the active area 204 in the periphery circuit area 203.

Figure 16:
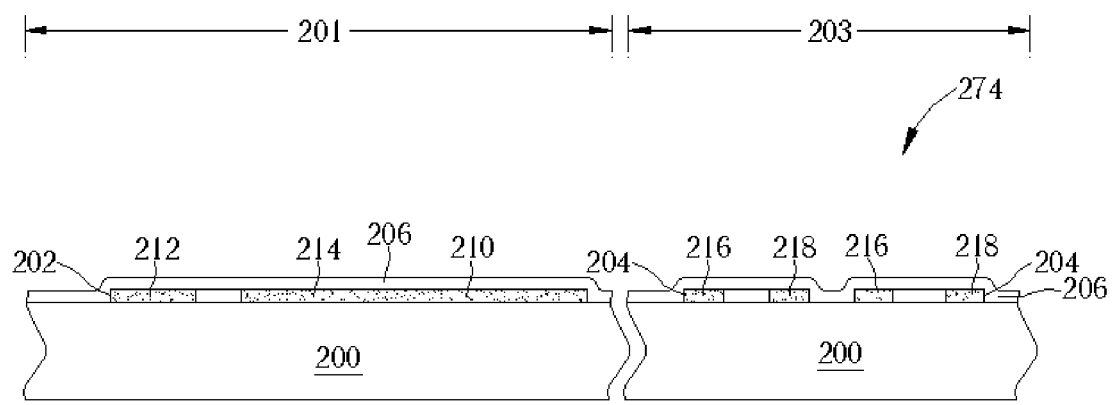
Figure 17:
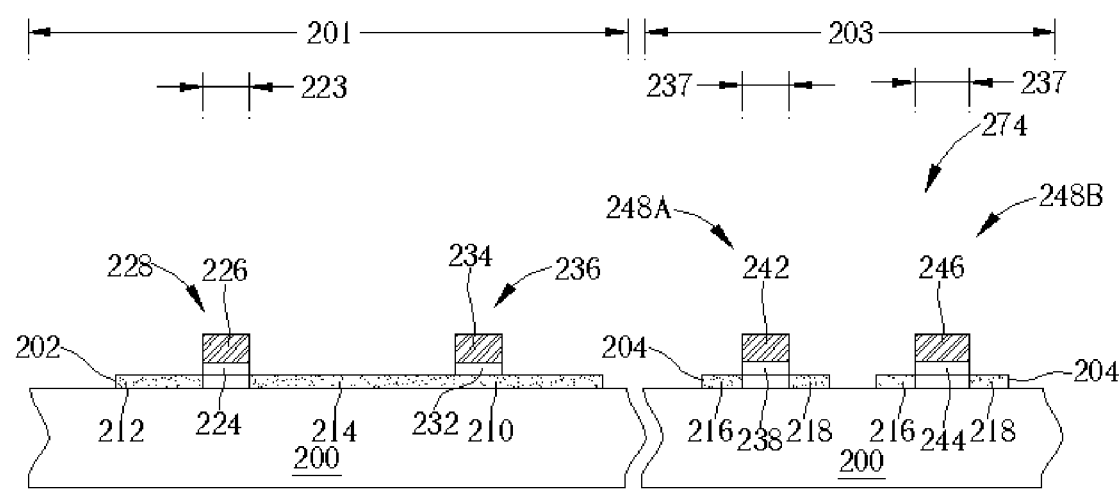

The first mask 208 is removed after the ion implantation process. As shown in FIG. 16, a metal layer (not shown) is formed on the surface of insulation substrate 200. The metal layer covers the first isolation layer 206, the active areas 202, 204, and the bottom storage electrode 210. The material composition of the metal layer comprises tungsten (W) or chrome (Cr). As shown in FIG. 17, a third photo-etching process is thereafter performed to remove portions of the first isolation layer 206 and the metal layer to form a gate insulating layer 224 and a gate electrode 226 on the channel region 223 in the pixel array area 201 and complete the fabrication of the P-type LTPS TFT 228, and to form a capacitor dielectric layer 232 and a top storage electrode 234 on top of the bottom storage electrode 210 and complete the fabrication of the storage capacitor 236. Simultaneously, gate insulating layers 238, 244 and gate electrodes 242, 246 are formed on the channel regions 237 in the periphery circuit area 203 to complete the fabrication of the P-type LTPS TFTs 248A, 248B.

It should be noted that since the first isolation layer 206, being a single-layered structure or a double-layered structure, is not etched up or even not etched at all when performing the third photo-etching process. The first isolation layers 206 being underneath the gate electrodes 226, 242, 246 and the top storage electrode 234 are taken as the gate insulating layers 224, 238, 244 and the capacitor dielectric layer 232. In the figures, the first isolation layer 206 is shown completely removed to illustrate the preferred embodiment of the present invention. In addition, the thicknesses of the gate insulating layers are all less than the thickness of the gate electrodes.

Figure 18:
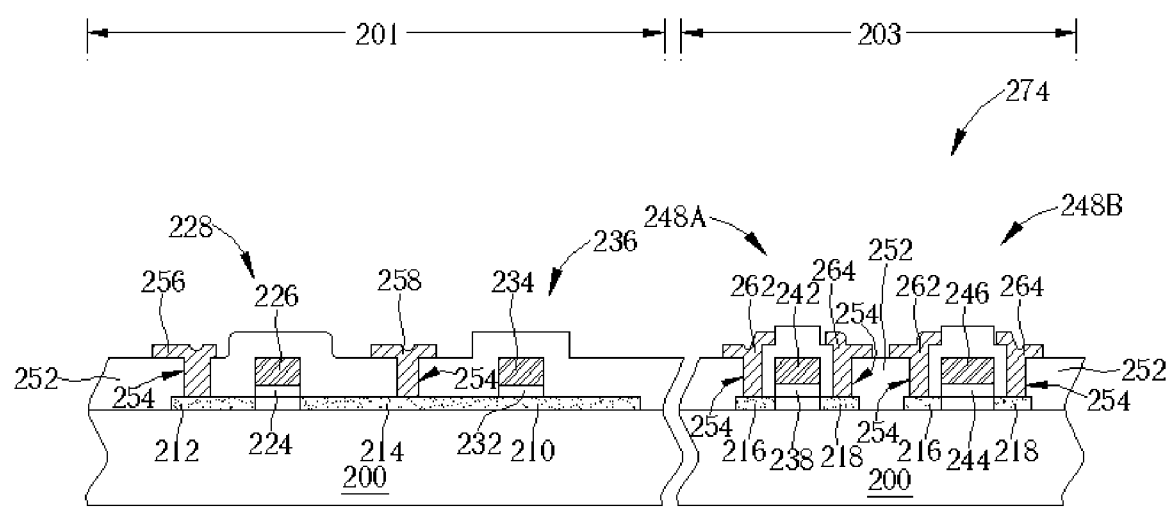

As shown in FIG. 18, a second isolation layer 252 is formed on a surface of the entire structure to cover the gate electrodes 226, 242, 246 and the top storage electrode 234. The material composition of the second isolation layer 252 comprises silicon oxide, silicon nitride, or silicon oxynitride. After that, a fourth photo-etching process is performed to remove portions of the second isolation layer 252 to form a plurality of first contact holes 254, electrically connected to the source electrodes 212, 216 and the drain electrodes 214, 218, respectively.

A conductive layer (not shown) is thereafter formed on a surface of the second isolation layer 252. The conductive layer fills up the first contact holes 254. Then a fifth photo-etching process is performed to remove portions of the conductive layer to form a source wire 256, electrically connected to the source electrode 212, on the surface of the second isolation layer 252 used as a data line of the LTPS TFT-LCD, and to form a drain wire 258, electrically connected to the drain electrode 214 in the pixel array area 201. Source wires 262, electrically connected to the source electrodes 216, and drain wires 264, electrically connected the drain electrodes 218, are formed on the surface of the second isolation layer 252 in the periphery circuit area 203 depending on practical requirements. It should be noted that a contact hole and a wire might be formed on top of the gate electrode.

Figure 19:
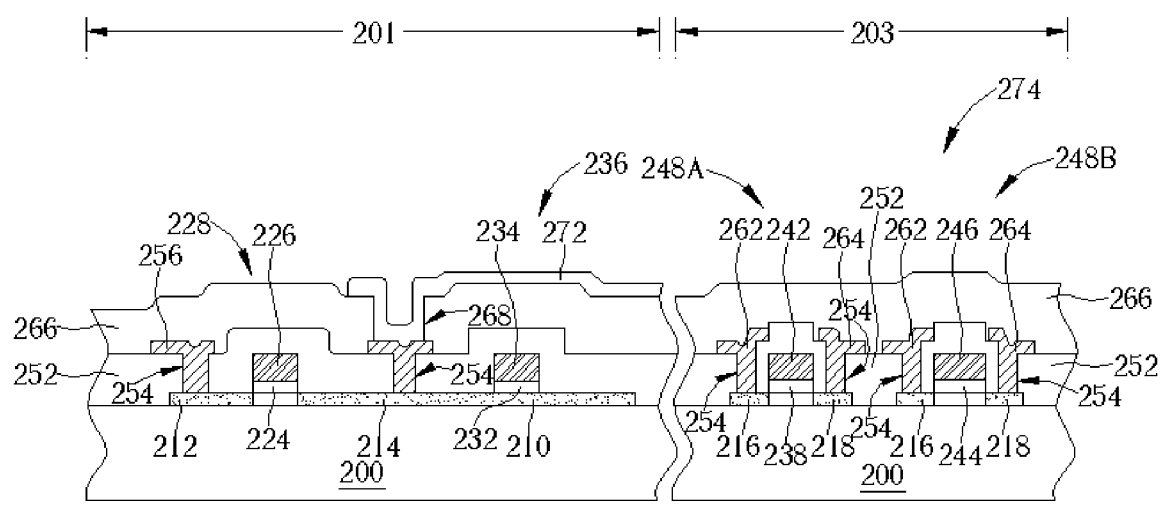

As shown in FIG. 19, a third isolation layer 266 is formed on a surface of the entire structure to cover the second isolation layer 252, the source wires 256, 262, and the drain wires 258, 264. The third isolation layer 266, being a planarization layer, comprises a silicon oxide layer, a silicon nitride layer, or a silicon oxide layer deposited by utilizing tetra-ethyl-ortho-silicate (TEOS) as a reaction gas. A sixth photo-etching process is performed to remove portions of the third isolation layer 266 to form a second contact hole 268 electrically connected to the drain wire 258. After that, a transparent conductive layer (not shown) is formed on a surface of the third isolation layer 266. The material composition of the transparent conductive layer comprises indium tin oxide (ITO) or indium zinc oxide (IZO). Finally, a seventh photo-etching process is performed to remove portions of the transparent conductive layer to form a pixel electrode 272 on the third isolation layer 266. The pixel electrode 272 is electrically connected to the drain wire 258 and the drain electrode 214 downward though the second contact hole 268 filled with the transparent conductive layer to complete the fabrication of the LTPS TFT-LCD 274.

The method of fabricating the LTPS TFT-LCD according to the present invention is to utilize a mask and a high concentration P-type ion implantation process to form the source electrode and the drain electrode of the P-type TFT in the pixel array area, source electrodes and drain electrodes of the P-type LTPS TFTs, and to simultaneously dope the bottom electrode of the capacitor. The gate electrodes are then formed. Therefore, not only is the total number of the photolithography and ion implantation processes reduced, the alignment error is also reduced. The problem of device defects is improved to improve the high reliability performance of the product. Since the present invention method dopes high concentration dopants into the bottom storage electrode and fabricates each source electrode and each drain electrode simultaneously, the resistivity of the bottom storage electrode is ensured to reach the expected value to greatly improve the high reliability performance in an aging test. In addition, since the leakage current of the P-type LTPS TFT is lower than that of the N-type LTPS TFT, and the leakage current of the P-type LTPS TFT is more easily controlled, and is thus very suitable to be used in the pixel array area. When applying the present invention method to a practical production line, a LTPS TFT-LCD having good electrical performance, good high reliability performance, and good image quality is fabricated.

In comparison with the prior art method of fabricating the LTPS TFT-LCD, the present invention discloses a method of fabricating a LCD composed of P-type LTPS TFTs by utilizing seven photo-etching process. The number of photolithography processes and ion implantation processes is decreased to simplify the process. The risk of alignment errors is also reduced to improve the device defect problem to improve the high reliability performance. Furthermore, since the leakage current of the P-type LTPS TFT is lower than that of the N-type LTPS TFT, and the leakage current of the P-type LTPS TFT is more easily controlled, the present invention effectively improves the electrical performance and image quality of a LCD.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a liquid crystal -display device-, the method comprising the steps of:
    providing a substrate;
    forming a polysilicon layer over the substrate;
    performing a first photo-etching process to define at least one active area and a bottom storage electrode over the substrate;
    performing a second photo-etching process to form a first mask over the substrate;
    performing a P-type ion implantation process by utilizing the first mask as a mask to form a source electrode and a drain electrode in the active area and to dope dopants into the bottom storage electrode simultaneously;
    removing the first mask;
    forming a metal layer over the substrate to cover the active area and the bottom storage electrode;
    performing a third photo-etching process to form a gate electrode over the active area and to form a top storage electrode on the bottom storage electrode;
    forming a first isolation layer over the substrate to cover the gate electrode and the top storage electrode;
    performing a fourth photo-etching process to form at least one first contact hole electrically connected to the source electrode, the drain electrode, and the gate electrode;
    forming a conductive layer over the first isolation layer to fill in the first contact hole;
    performing a fifth photo-etching process to form a source wire and a drain wire on the first isolation layer, the source wire and the drain wire being electrically connected to the source electrode and the drain electrode through the first contact hole respectively; and
    forming a second isolation layer over the substrate to cover the first isolation layer, the source wire, and the drain wire.

2. The method of claim 1 wherein the substrate comprises a glass substrate or a quartz substrate.

3. The method of claim 1 wherein the method for forming the polysilicon layer further comprises the following steps:
    performing a sputtering process to form an amorphous silicon layer on the surface of the substrate; and
    performing an annealing process to re-crystallize the amorphous silicon layer to the polysilicon layer.

4. The method of claim 3 wherein the annealing process is an excimer laser annealing process.

5. The method of claim 1 wherein the P-type ion implantation process is a high concentration P-type ion implantation process to form the source electrode and the drain electrode.

6. The method of claim 1 wherein a step for forming a third isolation layer over the entire substrate is performed before the second photo-etching process to cover the active area and the bottom storage electrode.

7. The method of claim 6 wherein the material composition of the third isolation layer comprises silicon oxide, silicon nitride, or silicon oxide which is formed by utilizing tetra-ethyl-ortho-silicate as a reaction gas.

8. The method of claim 1 wherein a step for forming a fourth isolation layer on the entire substrate is performed after removing the first mask to cover the active area and the bottom storage electrode.

9. The method of claim 8 wherein the material composition of the fourth isolation layer comprises silicon oxide, silicon nitride, or silicon oxide which is formed by utilizing tetra-ethyl-ortho-silicate as a reaction gas.

10. The method of claim 1 wherein the material composition of the metal layer comprises tungsten (W) or chrome (Cr).

11. The method of claim 1 wherein the first isolation layer comprises a silicon oxide layer, a silicon nitride layer, or a silicon oxynitride layer.

12. The method of claim 1 wherein the source wire is used as a data line.

13. The method of claim 1 wherein the second isolation layer is a planarization layer, and the second isolation layer comprises a silicon oxide layer, a silicon nitride layer, or a silicon oxide layer formed by utilizing tetra-ethyl-ortho-silicate as a reaction gas.

14. The method of claim 1 wherein the material composition of the transparent conductive layer comprises indium tin oxide (ITO) or indium zinc oxide (IZO).

15. The method of claim 1 further comprising the following steps:
    performing a sixth photo-etching process to remove portions of the second isolation layer to form at least one second contact hole electrically connected to the drain wire;
    forming a transparent conductive layer on the second isolation layer; and
    performing a seventh photo-etching process to remove portions of the transparent conductive layer to form at least one pixel electrode on the second isolation layer, each pixel electrode being electrically connected to each drain wire through each second contact hole filled with the transparent conductive layer.

* * * * *